(12) United States Patent
Lysinger

(10) Patent No.: US 6,373,737 B1
(45) Date of Patent: Apr. 16, 2002

(54) CONTENT ADDRESSABLE MEMORY

(75) Inventor: Mark A. Lysinger, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 08/478,429

(22) Filed: Jun. 7, 1995

Related U.S. Application Data

(63) Continuation of application No. 08/350,516, filed on Dec. 6, 1994, now abandoned, which is a continuation of application No. 08/213,474, filed on Mar. 15, 1994, now abandoned, which is a continuation of application No. 07/531,011, filed on May 31, 1990, now abandoned.

(51) Int. Cl.$^7$ .............................................. G11C 15/04
(52) U.S. Cl. .................................... 365/49; 365/189.07
(58) Field of Search .............................. 365/49, 189.07

(56) References Cited

U.S. PATENT DOCUMENTS 4,532,606 A * 7/1985 Phelps .......................... 365/49
4,959,811 A * 9/1990 Szczepanek .................. 365/49

OTHER PUBLICATIONS

Donald E. Knuth, *The Art of Computer Programming*, vol. 3 "Aorting and Searching" (1973), p. 393–94.

* cited by examiner

Primary Examiner—A. Zarabian
(74) Attorney, Agent, or Firm—Lisa K. Jorgenson

(57) ABSTRACT

A content addressable memory includes a memory array having a plurality of entries. Control circuitry is provided for sequentially presenting each entry in the array to a comparator. An input signal is also provided to the comparator. Entries matching the input signal are identified for later use. The input signal can be masked, so that only selected fields of each entry are compared to it. Conventional RAM technology can be used for the memory array. In the alternative, a serial memory array, such as an array formed from a charge coupled device, can be used.

15 Claims, 2 Drawing Sheets

CONTENT ADDRESSABLE MEMORY

This is a continuation of application Ser. No. 07/531,011, filed May 31, 1990 abandoned.

This is a continuation of application Ser. No. 08/213,474, filed Mar. 15, 1984 abandoned.

This is a continuation of application Ser. No. 08/350,516, filed Dec. 6, 1994 abandoned.

BACKGROUND OF THE INVENTION

1. Field of the Invention

The present invention relates generally to memory systems and

2. Description of the Prior Art

Content addressable memories are used to find matches between an input data signal and data stored in a memory. Traditional content addressable memories have comparison circuitry imbedded in each cell of the memory array. This allows the input signal to be compared with all entries within the memory at the same time. This traditional design is very fast, in that a complete catalogue of all matching entries can be made available within approximately one memory cycle of the underlying memory array.

Such an approach is also relatively expensive. Inclusion of comparison circuitry in the memory array requires more cell area than is required in a conventional static random access memory (SRAM) cell. The physical chip size of such a content addressable memory is quite large for higher density devices.

If comparison functions other than a direct comparison, such as less than, greater than or equal to, and so forth, are to be used, the number of transistors used for each cell can easily be doubled over a standard SRAM cell. This more than doubles the layout area of the cell, resulting in a large device.

A large content addressable memory would be useful at a system level for many applications. For example, database searching, and other searching and selection applications, often perform simple comparisons on a large block of data. Presently, these searches are performed using software by scanning through a large number of memory locations looking for a match. As is known in the art, this can be an extremely time consuming process. Content addressable memories are not used to perform such functions in hardware because of their small size and high expense.

It would be desirable to provide a large content addressable memory suitable for use with larger search and compare operations. It would further be desirable if such a memory maintained a small chip size and was relatively inexpensive.

SUMMARY OF THE INVENTION

It is therefore an object of the present invention to provide a content addressable memory suitable for implementation in an integrated circuit.

It is a further object of the present invention to provide such a content addressable memory which provides access to a relatively large number of entries at a reasonably fast rate.

It is another object of the present invention to provide such a content addressable memory which is simple in design, relatively inexpensive, and compatible with current technology.

Therefore, according to the present invention, a content addressable memory includes a memory array having a plurality of entries. Control circuitry is provided for sequentially presenting each entry in the array to a comparator. An input signal is also provided to the comparator. Entries matching the input signal are identified for later use. The input signal can be masked, so that only selected fields of each entry are compared to it. Conventional RAM technology can be used for the memory array. In the alternative, a serial memory array, such as an array formed from a charge coupled device, can be used.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
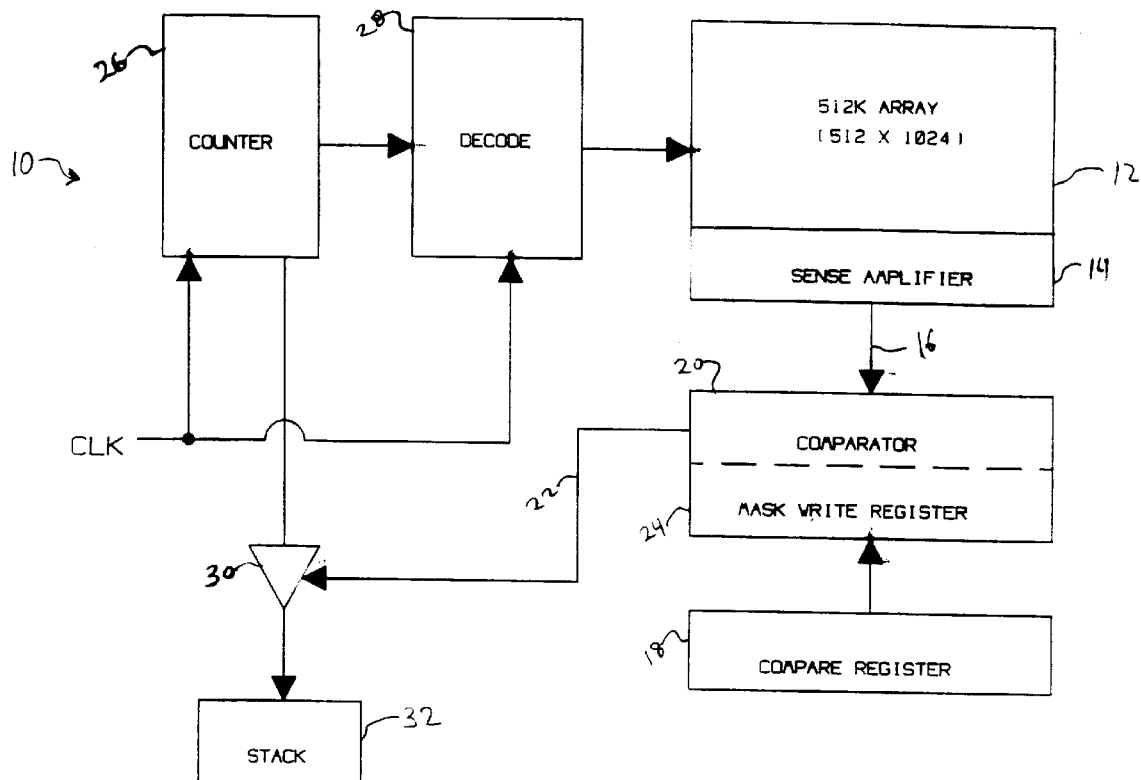
FIG. 1 is a block diagram of a content addressable memory according to the present invention.

Referring to FIG. 1, a content addressable memory is referred to generally by reference number 10. A random access memory array 12 is preferably organized as a 512 entry by 1024 bit array. A sense amplifier 14 connected to the memory array 12 senses the data stored in a s elected entry of the array 12 and presents it as output on signal line 16. Signal line 16 is in this example embodiment, 1024 bits wide.

A compare register 18 is used to store an input signal value to be compared to each entry of the array 12. A comparator 20 compares the value stored in the compare register 18 with the value present ed on signal line 16, and generates an output signal on line 22 indicating whether or not a match has occurred. A mask write register 24 contains a 1024 bit mask value which can be preloaded by the user. The data in the mask write register 24 determines which bits of an entry are actually compared in the comparator 20. This allows selected sub-fields of a 1024 bit entry to be used in the comparison process.

A counter 26 is used to cycle through the values 0–(n−1), where n is the number of entries in the memory array 12. The output of counter 26 is connected to a decoder 28, which in turn selects one entry within the memory array 12. A clock signal CLK is used to synchronize operation of the counter 26 and decoder 28.

An alternative technique is to use a shift register for the decoder 28. This technique is similar to that used in FIFO memories, and uses a single active bit in the shift register to indicate which row is selected from the array 12. This technique provides faster access to the array 12, but is more complex to implement.

Counter 26 also connects its output signal to select circuitry 30. When a match is found between the value stored in the compare register 18 and the value of the currently selected entry, as indicated on signal line 22, select circuitry 30 causes the appropriate counter value to be written into a stack buffer 32. Stack 32 is used to retain an entry corresponding to each entry of the memory array 12 which matches the value stored in the compare register 18. Stack 32 may be arranged as desired, and may actually be used as a stack. It may also be organized as a queue, or it may be a register for storing a single value. In most cases, if stack 32 is actually a single register, the signal on line 22 will also cause the clock signal CLK to halt temporarily while the value stored in stack 32 is handled by other, system level, control circuitry (not shown).

In operation, a mask value is written into the mask write register 24, and a comparison value is written into the compare register 18. Counter 26 is initialized to 0, and clocked 512 times in order to sequentially access each entry of the memory array 12. When an entry in the memory array 12 matches the value of the compare register 18, as masked by the value in the mask register 24, the corresponding entry number is written to the stack 32. These values may be later used to access the memory array 12 directly, by applying them to the decoder 28.

The mask and compare registers 18, 24 may be written to directly from off chip. Alternatively, they may be loaded with values already in the memory array 12. By presetting the counter 26, the contents of one row are made available at the sense amplifier 14. This value can be copied directly to the mask register 24 or compare register 18 if desired. This allows one entry to be compared to the others in an efficient manner.

Figure 2:
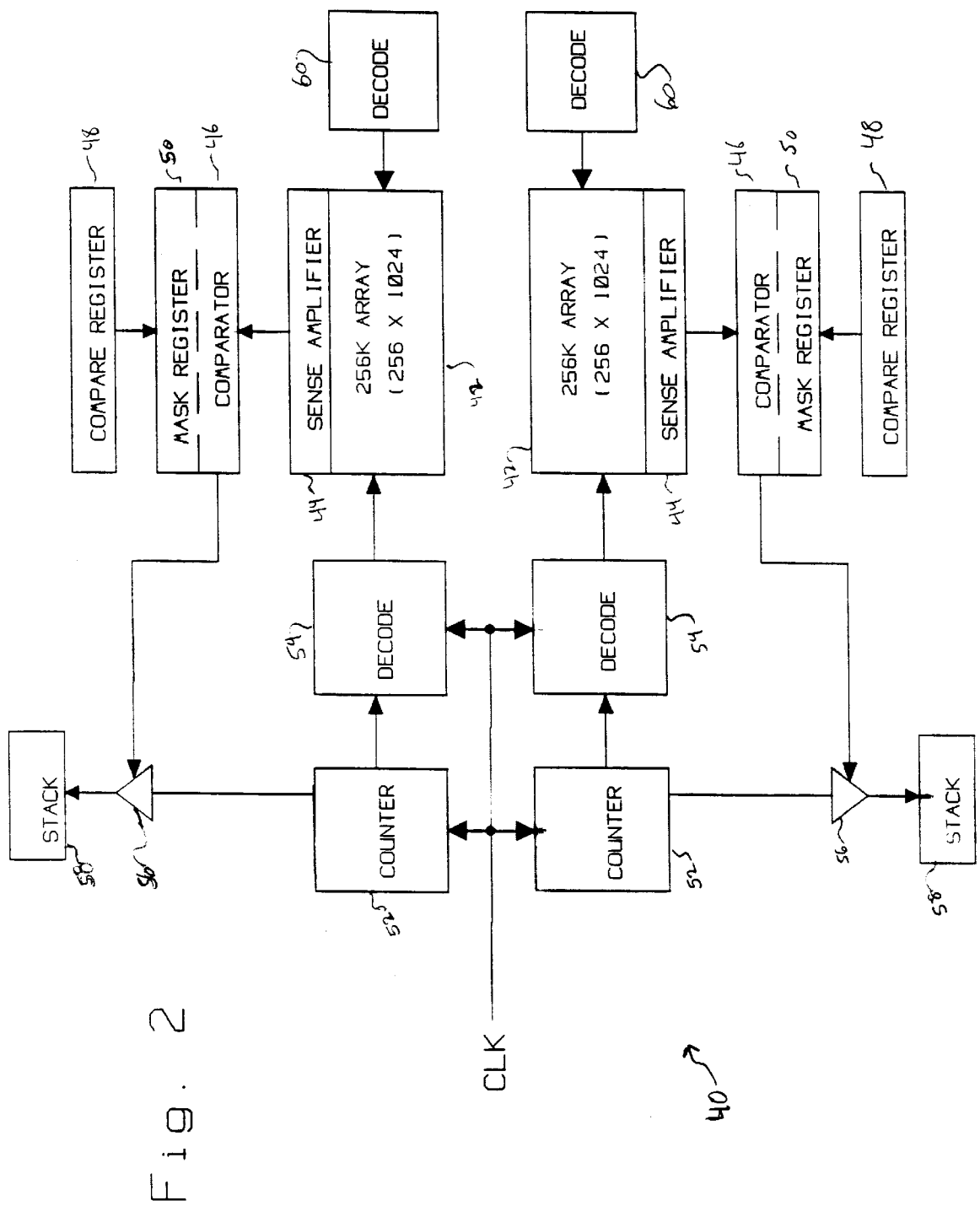
FIG. 2 is an alternative embodiment of a content addressable memory according to the present invention.

FIG. 2 shows an alternative design for a content addressable memory 40 which differs slightly from the content addressable memory 10 illustrated in FIG. 1. Two memory arrays 42 each have a sense amplifier 44. The entries within the memory arrays 42 are compared in comparators 46 to the value stored in compare registers 48. Masking is performed, if desired, by data stored in mask registers 50.

Counters 52 and decoders 54 are used to address the various entries within the arrays 42. Control circuitry blocks 56, controlled by outputs from the comparators 46, are used to place data into the stack buffers 58 in the same manner as described in FIG. 1.

Each array 42 is shown as having 256 entries, so that, combined, they contain the same number of entries as the memory array 12 shown in FIG. 1. Since the memories are separated, however, a complete comparison can be performed in one-half the time as is required for the embodiment shown in FIG. 1. If desired, counters 52 and decoders 54 can be combined into a single counter 52 and decoder 54, to minimize chip layout area. The compare registers 48 can be combined into a single compare register connected to the mask registers 50 if desired. If the layout is retained as shown in FIG. 2, two comparisons can be performed. If only a single compare register 48 is used, only one value can be checked for at a time.

Decoders 60 may also be used to access the memory arrays 42. These decoders may be connected to externally available address pins to allow direct access to be made to the memory arrays 42. This allows individual entries, or portions thereof, to be read from and written to by the external system. The compare register 48 and comparator 46 can be bypassed during such direct access, so that the input/output buffers are connected directly to the sense amplifiers 44. Alternatively, the data to be input to or output from the arrays 42 may pass through the compare registers 48 by connecting them directly to the sense amplifiers 44 when direct input/output to the array is to be performed.

If desired, decoders 54 can be designed so as to select entries within the arrays 42 based on the outputs of counters 52, and to provide direct input/output to arrays 42 instead of using decoders 60. However, in many instances, it will be more efficient to use separate decoding circuitry 60 for the direct input/output. Decoder 54 is optimized to address data entries which are 1024 bits wide. Use of a separate decoder 60 to access the memory array 42 using data words 16 or 32 bits wide will result in higher device performance in many cases. The separate decoder 60 can also be used with the single array content addressable memory 10 described in connection with FIG. 1.

Figure 3:
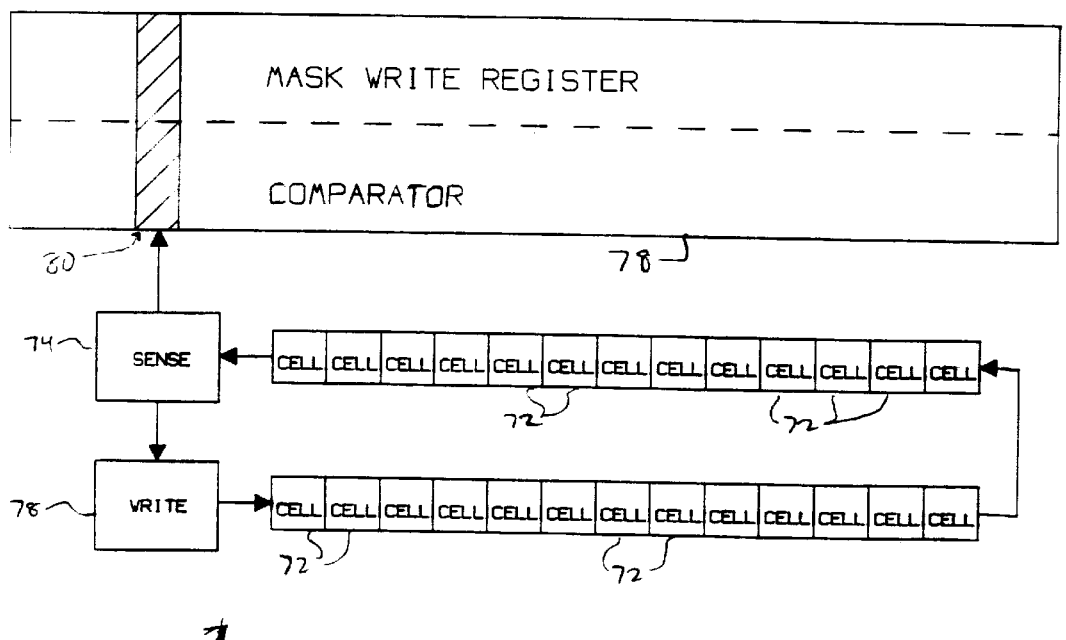
FIG. 3 is a second alternative embodiment of a content addressable memory according to the present application.

Referring to FIG. 3, a content addressable memory generally referenced by number 70 is shown which uses a serial access memory in place of the memory array 10. Such serial access memory can be, for example, a charge coupled device (CCD) or other serially accessed device such as a bubble memory.

A column of CCD cells 72 are connected as known in the art to form a circulating loop. A sense circuit 74 senses the current value in the first cell 72 of the loop, and write circuit 78 simultaneously writes a value into the last cell 72 of the loop. Clocking signals are provided to the loop as known in the art to shift the data in the CCD cells 72 from the last cell, where they are written, to the first cell, where they are read.

The number of cells 72 within the loop is the number of entries within the content addressable memory 70. A plurality of loops, corresponding to the bit positions of the entries within the content addressable memory, are connected to the comparator 78. Thus, if a 1024 bit entry is desired, there are 1024 separate circulating loops of CCD cells 72. Each sense circuit 74 is connected to one bit position 80 of the comparator 78.

Since the loop of CCD cells 72 is a serially accessed memory, direct access of any particular entry is not possible. Instead, it is necessary to cycle through the memory until the desired entry has reached the first cell. At this time, any desired value can be written into that entry by connecting the contents of a register (not shown) to the write circuits for each of the loops.

Although serial access memories such as CCDs cannot be accessed directly as can the random access memories used in FIGS. 1 and 2, use of such memories have several advantages which may be desirable in some designs. CCD memories are very dense, allowing a relatively large memory to be made on a physically small device. In addition, it is possible to store analog values into CCD cells, so that multiple bits can be stored in each cell. The storage density of storing such signals in such manner must be traded off against the additional complexity and time required to decode these analog signals into their corresponding digital signals.

The 3 embodiments shown in FIGS. 1–3 illustrate a number of design tradeoffs which must be considered when fabricating content addressable memories according to the present invention. FIG. 1 shows a device which is somewhat slower than the embodiment shown in FIG. 2, but consumes less power due to the lesser number of sense amplifiers 14 and the smaller amount of control circuitry on chip. If, for example, each entry within the memory array 12 can be accessed with a cycle time of 30 nanoseconds, the total compare time for 512 entries is 15 microseconds.

The device of FIG. 2 consumes approximately twice the power of that shown in FIG. 1, due to the extra sense amplifier 44. However, the same number of memory entries can be accessed in half the time. Assuming a 30 nanosecond cycle time, a 512 entry comparison can be performed in 7.5 microseconds, since only 256 comparison cycles are required.

The device shown in FIG. 3 can be made to use very low power and with high device density. It has the drawback however, that entries within the memory cannot be accessed directly for input and output as can the random access memories of FIGS. 1 and 2.

It will be apparent to those skilled in the art that memory arrays having a greater or lesser number of entries, and having different numbers of bits per entry, can be made using the techniques of the present invention. The number of entries in the array, which determines the time needed to perform a complete comparison, and the width of each of these entries can be varied by the designer to accommodate different requirements. The described serial access technique allows a relatively large content addressable memory to be fabricated on a single integrated circuit chip using current technology. Although it is not as fast as a traditional content addressable memory which is accessed in parallel, it can be built much less expensively and allows for the fabrication of large memories.

In addition, the function of the comparators in the various embodiments can be made more complex if desired. In traditional content addressable memories, adding comparison functions such as less than, less than or equal to, greater than, greater than or equal to, and so forth, greatly increases the chip area required to implement the comparison function. Since only a single comparator is used for a large number of memory entries in the present technique, the comparison functions which can be applied between the memory entries and the input values can be made quite complex without adversely impacting the overall chip area required for implementation of the device. The ability to provide more complex comparison functions makes the content addressable memory more useful in some system level applications.

While the invention has been particularly shown and described with reference to a preferred embodiment, it will be understood by those skilled in the art that various changes in form and detail may be made therein without departing from the spirit and scope of the invention.

What is claimed is:

1. A content addressable memory, comprising:
    a random access memory, organized as a plurality of rows having a preselected number of bits, each row selectable by a row address;
    a counter for sequentially generating row addresses to be presented to the random access memory;
    a register for storing an input value to be compared to the rows of said memory, said register having a number of bits equal to the number of bits in each random access memory row;
    a single comparator for comparing, in sequence, each selected row with the value stored in said register, wherein said comparator compares a row and the value stored in said register in a single step, and for generating a signal indicative of whether a match occurs; and
    means connected to said comparator for storing the row addresses generated by the counter for each row which causes a signal indicative of a match to be generated.

2. The content addressable memory of claim 1, wherein said storing means stores the identifying row addresses in a stack.

3. The content addressable memory of claim 1, wherein said storing means stores the identifying row addresses in a queue.

4. The content addressable memory of claim 1, further comprising:
    a mask register connected to said comparator for holding a mask value and for selecting a subset of bit positions of the value in said register to be compared with the data in each selected row, wherein the signal indicative of a match is generated when a match occurs in the selected subset.

5. The content addressable memory of claim 1, further comprising:
    a decoder connected to said random access memory, said decoder capable of addressing a portion of the memory smaller than one row, wherein data may be read directly from and written directly to said random access memory.

6. The content addressable memory of claim 1, wherein said counter comprises:
    counting circuitry for sequentially generating row addresses; and
    a decoder connected to said counting circuitry for selecting memory rows corresponding to the generated row addresses.

7. The content addressable memory of claim 1, wherein said counter comprises:
    counting circuitry for sequentially generating row addresses; and
    a shift register connected to said memory for generating a single bit indicating a selected row, wherein the row indicated by such single bit is selected for comparison in said comparator, and for shifting such bit through all rows in synchronization with the row addresses generated by said counting circuitry.

8. A content addressable memory, comprising:
    a data storage array arranged as a matrix of rows and columns, each row having a selected number of bits, each row further having an identifying row address;
    a register for storing a value representing an input signal, wherein said register has a number of data bits equal to each row of the data storage array;
    a single comparator for comparing a row in said array with an input signal stored in said register, and for generating an output signal when a match occurs;
    select means for sequentially presenting each row of said array to said comparator for comparison with the input signal, wherein an identifying row address for each row is generated simultaneously; and
    means for storing the identifying row address for each row for which a match occurs between the input signal and any rows of said array.

9. The content addressable memory of claim 8, wherein the identifying addresses are stored in a stack.

10. The content addressable memory of claim 8, wherein said data storage array comprises;
    a plurality of serial shift storage devices arranged in parallel;
    and wherein said select means comprises a means for shifting data in each serial shift storage device one position while generating a corresponding next row address.

11. The content addressable memory of claim 10, wherein said serial shift storage devices comprise charge coupled devices.

12. The content addressable memory of claim 10, wherein said serial shift storage devices comprise bubble memory devices.

13. The content addressable memory of claim 8, further comprising:

a mask register for holding a mask value and for selecting a subset of bit positions of the input signal and the presented row to be compared, wherein the signal indicative of a match is generated when a match occurs in the selected subset.

14. A method for accessing a memory according to contents of data stored therein, comprising the steps of:

storing data into a memory array having a plurality of rows, each row having a preselected number of data bits, and an identifying row address;

loading an input value into a register having a number of bits equal to the number of bits in each memory array row;

sequentially selecting each row of the memory array by sequentially generating row addresses, and selecting a single row identified by each row address;

comparing the data in each selected row with the input value; and for each row which matches the input value, storing the identifying row address of such matching row.

15. The method of claim 14, further comprising the step of:

storing a masking value having a number of bits equal to the number of bits in the register;

wherein said comparing step compares only a subset, indicated by the masking value, of the bits in the register with the corresponding bits in each selected row, and a match is indicated if the subsets match.

* * * * *